(12) United States Patent
Matsumoto (10) Patent No.: US 7,452,814 B2
(45) Date of Patent: Nov. 18, 2008

(54) METHOD OF POLISHING GAN SUBSTRATE

(75) Inventor: Naoki Matsumoto, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 11/486,012

(22) Filed: Jul. 14, 2006

(65) Prior Publication Data

US 2006/0283840 A1  Dec. 21, 2006

Related U.S. Application Data

(63) Continuation of application No. PCT/JP2005/024057, filed on Dec. 28, 2005.

(30) Foreign Application Priority Data

Jan. 12, 2005 (JP) .............................. 2005-005497

(51) Int. Cl.
*H01L 21/302* (2006.01)
(52) U.S. Cl. ................ 438/689; 438/692; 438/702; 438/707; 216/88; 216/89; 257/76; 257/103; 156/345.12
(58) Field of Classification Search ................ 438/692; 216/88; 257/76
See application file for complete search history.

(56) References Cited

U.S. PATENT DOCUMENTS 5,743,788 A * 4/1998 Vanell .......................... 451/41
6,136,138 A * 10/2000 Yagisawa ................ 156/345.12
2002/0031979 A1* 3/2002 Sakurada et al. ................ 451/5
2004/0221799 A1 11/2004 Nakayama et a.
2005/0029539 A1* 2/2005 Toda et al. ................... 257/103
2005/0145879 A1 7/2005 Nakayama et al.

FOREIGN PATENT DOCUMENTS

| CN | 1312545 A | * | 9/2001 |
| JP | 62-102970 A | | 5/1987 |
| JP | 2001-205556 A | | 7/2001 |
| JP | 2001-322899 A | | 11/2001 |
| JP | 2001-355899 | | 12/2001 |
| JP | 2002-64099 A | | 2/2002 |
| JP | 2003-305638 A | | 10/2003 |

(Continued)

OTHER PUBLICATIONS

D.A. Stocker, Applied Physics Letters, vol. 73, pp. 2654-2656, (1998).*

(Continued)

*Primary Examiner*—Nadine Norton
*Assistant Examiner*—Maki Angadi
(74) *Attorney, Agent, or Firm*—McDermott Will & Emery LLP (57) ABSTRACT

In a polishing method of a GaN substrate according to this invention, first, while supplying a polishing solution 27 containing abrasives 23 and a lubricant 25, onto a platen 101, the GaN substrate is polished using the platen 101 and the polishing solution 27 (first polishing step). Then the GaN substrate is polished using the platen 101 in which abrasives 29 are buried, while supplying a lubricant 31 onto the platen 101 in which the abrasives 29 are buried (second polishing step).

14 Claims, 9 Drawing Sheets

FOREIGN PATENT DOCUMENTS

| | | |
|---|---|---|
| JP | 2004-58220 A | 2/2004 |
| JP | 2004-281865 A | 10/2004 |
| JP | 2004-331686 A | 11/2004 |
| JP | 2004-335646 A | 11/2004 |
| JP | 2004-356609 A | 12/2004 |

OTHER PUBLICATIONS

English Translation of International Search Report issued in corresponding International Application No. PCT/JP2005/024057.

Chinese Office Action, with English translation, issued in Chinese Patent Application No. CN 200580001707.3, mailed Oct. 26, 2007.

English Translation of the International Preliminary Report on Patentability, issued in corresponding International Patent Application No. PCT/JP2005/024057, dated on Jul. 26, 2007.

Korean Notice of Allowance issued in Patent Application No. KR 10-2006-7012231 dated on Jul. 31, 2008.

Chinese Office Action, with English trnaslation, issued in Chinese Patent Application No. CN 200580001707.3, mailed Oct. 26, 2007.*

* cited by examiner

METHOD OF POLISHING GAN SUBSTRATE

CROSS REFERENCE TO RELATED APPLICATIONS

This application is a continuation of International Application No. PCT/JP2005/024057, filed on Dec. 28, 2005, which in turn claims the benefit of Japanese Application No. 2005-005497, filed on Jan. 12, 2005, the disclosures of which Applications are incorporated by reference herein.

TECHNICAL FIELD

The present invention relates to a method of polishing a GaN substrate.

BACKGROUND ART

For example, the method described in Patent Document 1 is known as a polishing method of a magnetic head slider. A lapping oil composition for final polishing, for example, described in Patent Document 2 is known as a polishing solution for polishing the magnetic head slider.

Incidentally, the method described in Non-patent Document 1, for example, is known as a polishing method of a GaN substrate (gallium nitride substrate) instead of the magnetic head slider. This method is to polish the GaN substrate, using a diamond paste of the grain size of 0.1 μm and a pad of a suede type, and thereafter to chemically polish the GaN substrate, using a mixed solution of KOH and NaOH.

Another known polishing method of the GaN substrate is, for example, the method described in Patent Document 3. This method is to polish the GaN substrate by free abrasive grains supplied onto a platen. Specifically, while gradually decreasing the grain sizes of free abrasive grains, the GaN substrate is polished at decreasing polishing speeds.

Patent Document 1: Japanese Patent Application Laid-Open No. 2001-205556
Patent Document 2: Japanese Patent Application Laid-Open No. 2004-58220
Patent Document 3: Japanese Patent Application Laid-Open No. 2001-322899
Non-patent Document 1: J. L. Weyher and three others, "Chemical polishing of bulk and epitaxial GaN," Journal of Crystal Growth, vol. 182, 1997, pp. 17-22.

DISCLOSURE OF THE INVENTION

Problem to be Solved by the Invention

However, when the GaN substrate is polished using the free abrasive grains, the free abrasive grains flocculate together to coarsen on the platen and the coarsened particles scratch the GaN substrate.

An object of the present invention is to provide a polishing method of a GaN substrate capable of suppressing occurrence of the scratch.

Means for Achieving the Object

In order to achieve the above object, a polishing method of a GaN substrate according to the present invention is a method of polishing a GaN substrate, comprising: a first polishing step of polishing the GaN substrate, using a first platen and a polishing solution, while supplying the polishing solution containing first abrasives and a first lubricant, onto the first platen; and a second polishing step of polishing the GaN substrate, using a second platen in which second abrasives are buried, while supplying a second lubricant onto the second platen in which the second abrasives are buried, after the first polishing step.

Here the second platen may be the first platen, or another platen different from the first platen. The second abrasives may be the first abrasives, or other abrasives different from the first abrasives. For example, the "second platen in which the second abrasives are buried" may be the first platen in which the first abrasives are buried, or the first platen in which other abrasives different from the first abrasives are buried, or another platen different from the first platen, in which other abrasives different from the first abrasives are buried.

In the polishing method of the GaN substrate of the present invention, the second abrasives are buried in the second platen in the second polishing step. For this reason, the second abrasives are prevented from flocculating together. Therefore, the second polishing step is able to polish the GaN substrate while suppressing the occurrence of scratch.

Preferably, a peripheral speed of the first platen and a peripheral speed of the second platen are not less than 7 m/min nor more than 57 m/min.

In this case, the polishing speed of the GaN substrate can be larger in the first and second polishing steps than in the case where the peripheral speed is less than 7 m/min. In addition, it becomes easier to stabilize rotation of the first platen and rotation of the second platen than in the case where the peripheral speed is larger than 57 m/min.

Preferably, the first abrasives are diamond grains. This can increase the polishing efficiency of the GaN substrate in the first polishing step.

Preferably, a constituent material of the first platen and a constituent material of the second platen are an alloy containing tin 50 or more % by mass. Since the alloy containing tin 50 or more % by mass is soft, a protruding amount of the first abrasives in the first platen and a protruding amount of the second abrasives in the second platen both become smaller. For this reason, it is feasible to keep small both surface roughness of the GaN substrate after the first polishing step and surface roughness of the GaN substrate after the second polishing step. It is also feasible to suppress the occurrence of scratch.

Preferably, the polishing method of the GaN substrate further comprises a facing step of cutting the second platen so as to achieve flatness of not more than 10 μm, before the second polishing step; and a charging step of burying third abrasives for forming the second abrasives, into the second platen, after the facing step and before the second polishing step.

Here the "flatness" means a difference between a maximum and a minimum among thicknesses of an object to be measured. The facing step and the charging step may be carried out before the first polishing step, or may be carried out after the first polishing step and before the second polishing step. In another possible arrangement, the facing step is carried out before the first polishing step, and the charging step is carried out after the first polishing step and before the second polishing step.

When the second platen is another platen different from the first platen, the "second platen in which the second abrasives are buried" is obtained, for example, by burying the third abrasives in the platen. When the first platen is also used as the second platen and when the charging step is carried out after the first polishing step, the "second platen in which the second abrasives are buried" is obtained, for example, by burying the third abrasives in the first platen. When the first platen is also used as the second platen and when the charging step is carried out before the first polishing step, the "second platen in which the second abrasives are buried" is obtained, for example, by first burying the third abrasives in the first platen and thereafter carrying out the first polishing step.

In this case, since the facing step is carried out, the flatness of the GaN substrate after the second polishing step is improved. Since the charging step is carried out, in-plane variation can be reduced in the protruding amount of the second abrasives. For this reason, in-plane variation is reduced in the polishing speed and surface roughness of the GaN substrate in the second polishing step.

Preferably, the first lubricant and the second lubricant consist primarily of ethylene glycol and water. In this case, it becomes easier to clean the GaN substrate, the first platen, and others after the first polishing step and to clean the GaN substrate, the first and second platens, and others after the second polishing step. Since the first lubricant and the second lubricant contain ethylene glycol, the first lubricant is prevented from evaporating in the first polishing step, and it is feasible to achieve anticorrosion of the first platen. In addition, the second lubricant is prevented from evaporating in the second polishing step, and it is also feasible to achieve anticorrosion of the second platen.

Preferably, the second polishing step uses the first platen as the second platen. In this case, there is no need for consideration to the individual difference between the first platen and the second platen, and thus the surface shape of the GaN substrate fits the surface shape of the second platen on the occasion of polishing the GaN substrate on the second platen after polished on the first platen. For this reason, it is feasible to suppress the occurrence of scratch.

In the case where the first platen is used as the second platen in the second polishing step, the polishing method of the GaN substrate preferably further comprises a cleaning step of cleaning foreign matter on the first platen, after the first polishing step and before the second polishing step. This decreases the occurrence of scratch and the surface roughness due to the foreign matter on the first platen, in the second polishing step.

Effect of the Invention

The polishing method of the GaN substrate of the present invention is able to suppress the occurrence of scratch.

DESCRIPTION OF REFERENCE SYMBOLS

1 GaN substrate; 21 third abrasives; 23 first abrasives; 25 first lubricant; 27 polishing solution; 29 second abrasives; 31 second lubricant; 101 first and second platens.

Best Mode for Carrying Out the Invention

Embodiments of the present invention will be described below in detail with reference to the accompanying drawings. In the description of the drawings, identical or equivalent elements will be denoted by the same reference symbols, without redundant description.

(Polishing Apparatus of GaN Substrate)

Figure 1:
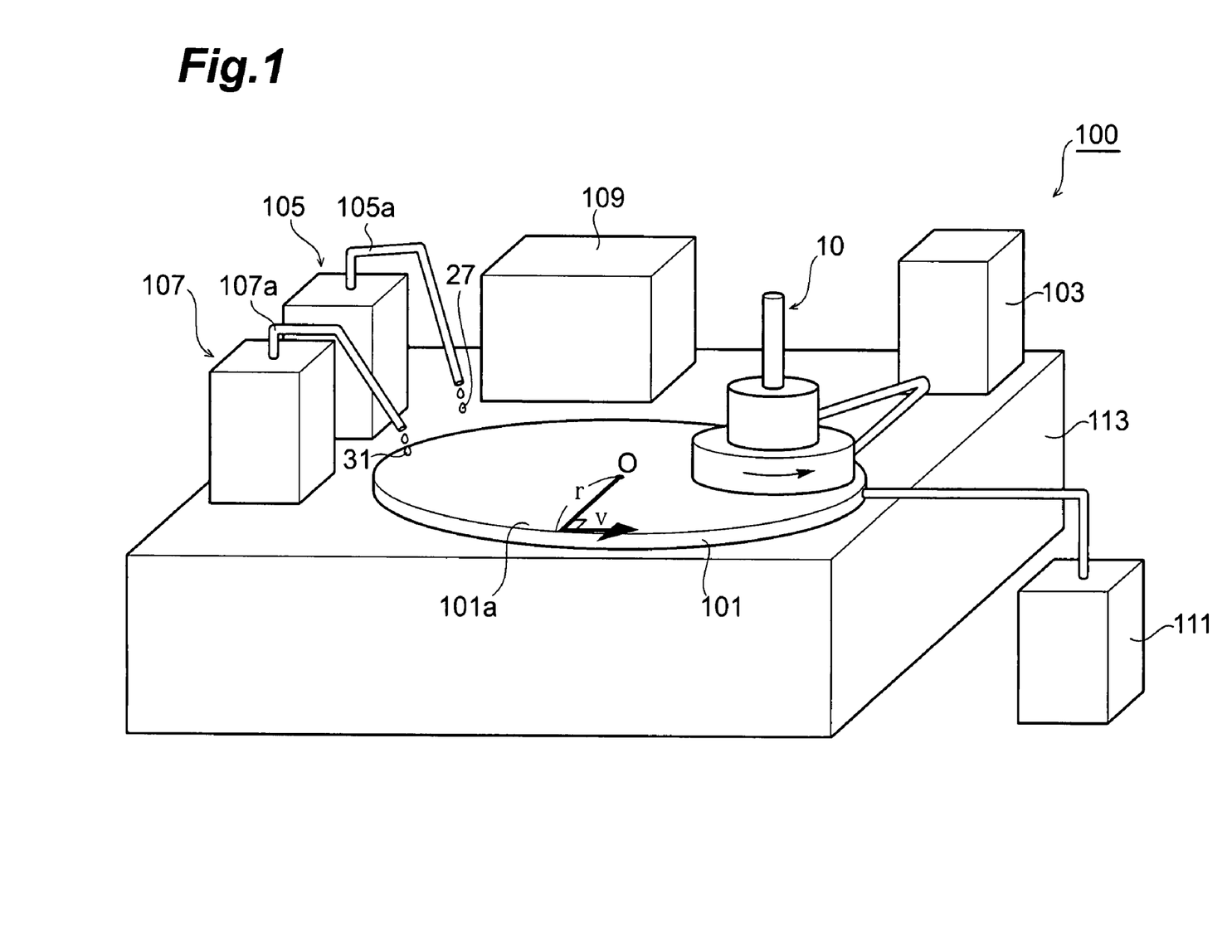
FIG. 1 is a schematic perspective view showing an example of polishing apparatus suitably applied to the polishing method of the GaN substrate according to an embodiment of the present invention.

FIG. 1 is a schematic perspective view showing an example of polishing apparatus suitably applied to the polishing method of the GaN substrate according to an embodiment of the present invention. The polishing apparatus 100 shown in FIG. 1 has a platen 101 placed on a table 113, and a polishing jig 10 mounted on a surface 101a of the platen 101. In the polishing apparatus 100, a GaN substrate is placed between the platen 101 and the polishing jig 10, and the GaN substrate is polished with rotation of the platen 101 and polishing jig 10. The GaN substrate is suitably used, for example, for devices such as LEDs and LDs.

The platen 101 is, for example, a disk having a center point O and a radius r. The platen 101 rotates, for example, counterclockwise at a peripheral speed v. A chiller 111 for chilling the platen 101 is connected to the platen 101. By using the chiller 111, the temperature of the platen 101 can be controlled to a temperature (e.g., 20° C.) equivalent to room temperature. In this case, the platen 101 is prevented from generating heat or from being deformed during polishing.

A motor 103 for rotating and swinging the polishing jig 10 is connected to the polishing jig 10. The motor 103 is located on the table 113. The polishing jig 10 is preferably arranged to rotate in the same direction as the rotating direction of the platen 101, e.g., counterclockwise.

The following devices are placed on the table 113: a facing mechanism 119 for cutting the surface 101a of the platen 101; a dropping device (dispenser) 105 for dropping a polishing solution 27 onto the surface 101a of the platen 101; a dropping device (dispenser) 107 for dropping a lubricant 31 onto the surface 101a of the platen 101. Each of the dropping devices 105, 107 has a drop nozzle 105a, 107a, respectively. These drop nozzles 105a, 107a deliver drops of the polishing solution 27 or lubricant 31. The polishing solution 27 is, for example, like a slurry. The polishing solution 27 and lubricant 31 are water-soluble, for example.

Figure 2:
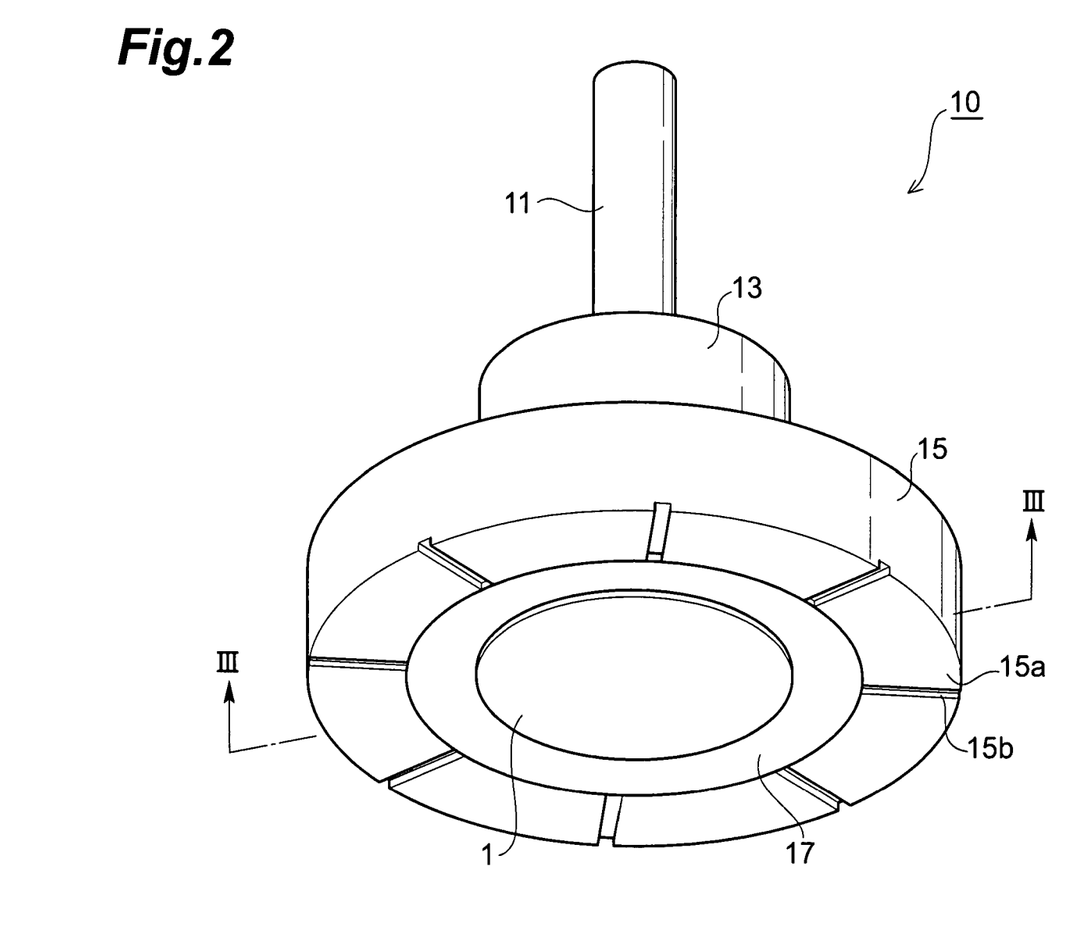
FIG. 2 is a schematic perspective view of a polishing jig shown in FIG. 1.
Figure 3:
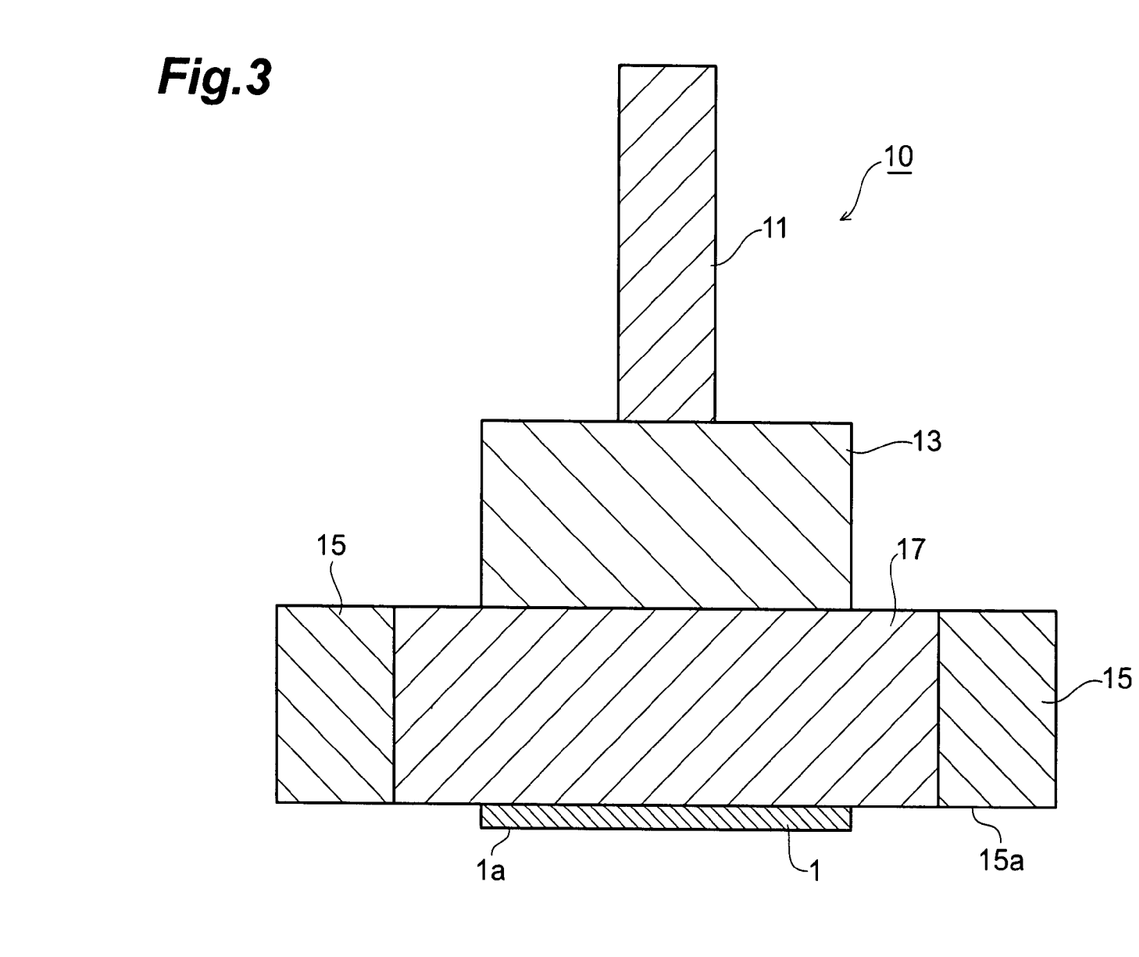
FIG. 3 is a vertical sectional view along line III-III shown in FIG. 2.

FIG. 2 is a schematic perspective view of the polishing jig 10 shown in FIG. 1. FIG. 3 is a vertical sectional view along line III-III shown in FIG. 2. The polishing jig 10 has a plate 17 to which a GaN substrate 1 is attached, and a drive ring 15 surrounding the plate 17. A weight 13 and a support rod 11 are placed in order on the plate 17.

The plate 17 is made, for example, of ceramic. The GaN substrate 1 is preferably bonded to the plate 17 With an adhesive such as wax. The GaN substrate 1 is uniformly pressed through the plate 17 onto the platen 101 by the weight 13. For example, grooves 15b are radially formed in a lower surface 15a of the drive ring 15. The polishing jig 10 is so arranged that a surface 1a of the GaN substrate 1 is in contact with the surface 101a of the platen 101 (cf FIG. 1).

Figure 4:
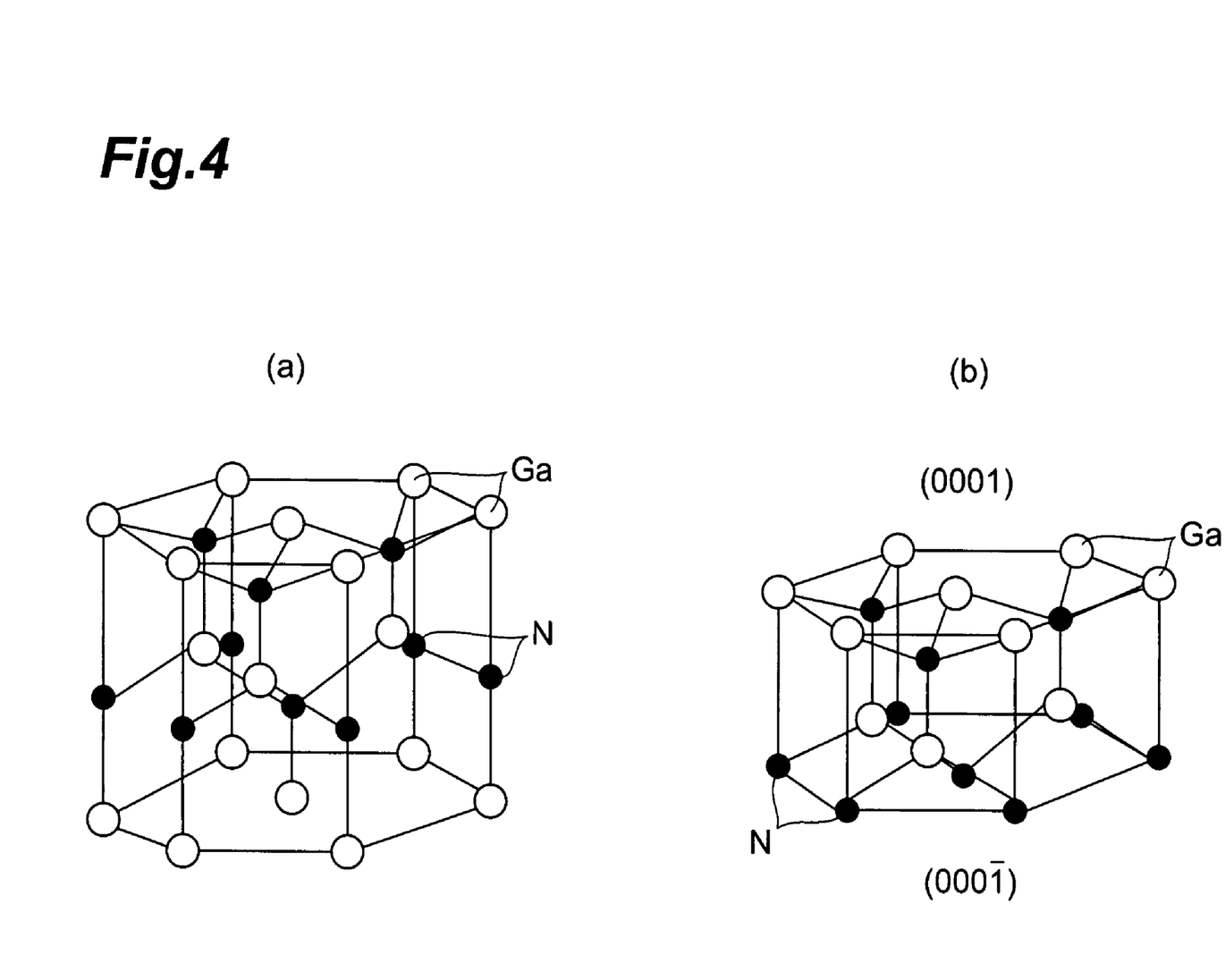
FIG. 4 is a drawing schematically showing a crystal structure of a GaN crystal forming a GaN substrate.

FIG. 4(a) and FIG. 4(b) are views schematically showing the crystal structure of the GaN crystal forming the GaN substrate 1. The GaN crystal has the wurtzite crystal structure of the hexagonal system as shown in FIG. 4(a). A GaN crystal body consisting of such a GaN crystal has the (0001) plane and (000-1) plane as shown in FIG. 4(b). The (0001) plane is a Ga surface, and the (000-1) plane an N surface. The Vickers hardness of the Ga surface is 1250 kg/mm$^2$, and the Vickers hardness of the N surface 1150 kg/mm$^2$. The Ga surface has higher chemical resistance to KOH than the N surface.

Where the GaN substrate 1 is a stripe core substrate, the Ga surfaces and N surfaces are arranged in a stripe pattern in the surface 1a of the GaN substrate 1 (cf. FIG. 3). It is noted that the GaN substrate 1 is not limited to the stripe core substrate. The "stripe core substrate" herein refers to a substrate in a surface of which low-crystal-defect regions extending linearly and having a predetermined width and high-crystal-defect regions extending linearly and having a predetermined width are alternately arranged. The details of the stripe core substrate are described, for example, in Japanese Patent Application Laid-Open No. 2004-335646.

(Polishing Method of GaN Substrate)

The polishing method of the GaN substrate according to the present embodiment is suitably carried out with the above-described polishing apparatus 100.

Figure 5:
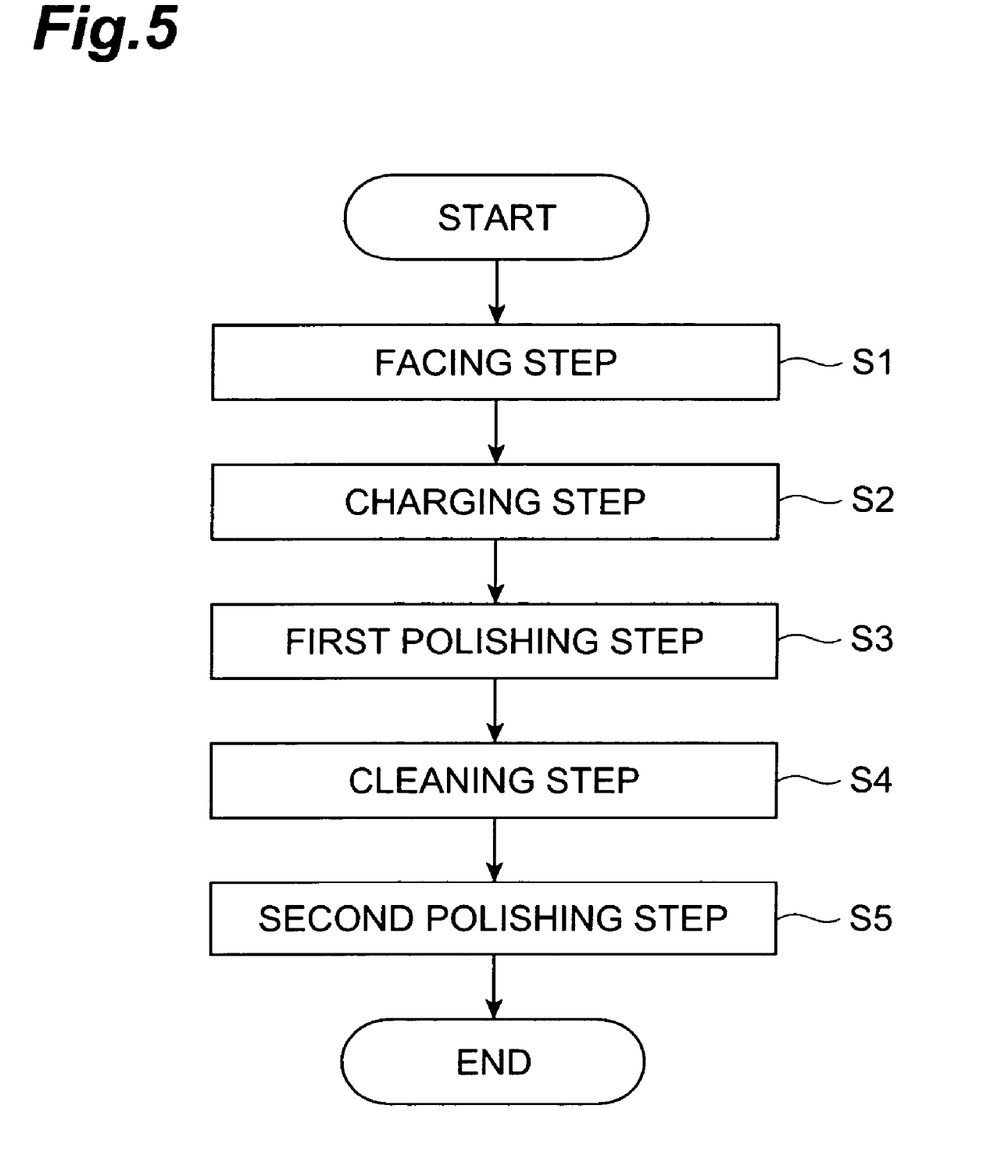
FIG. 5 is a flowchart showing an example of the polishing method of the GaN substrate according to an embodiment of the present invention.

FIG. 5 is a flowchart showing an example of the polishing method of the GaN substrate according to the present embodiment. In this polishing method of the GaN substrate, for example, a facing step (step S1), a charging step (step S2), a first polishing step (step S3), a cleaning step (step S4), and a second polishing step (step S5) are carried out in order. The present embodiment is based on the assumption that the platen 101 used in the first polishing step is also used as a platen used in the second polishing step.

Figure 6:
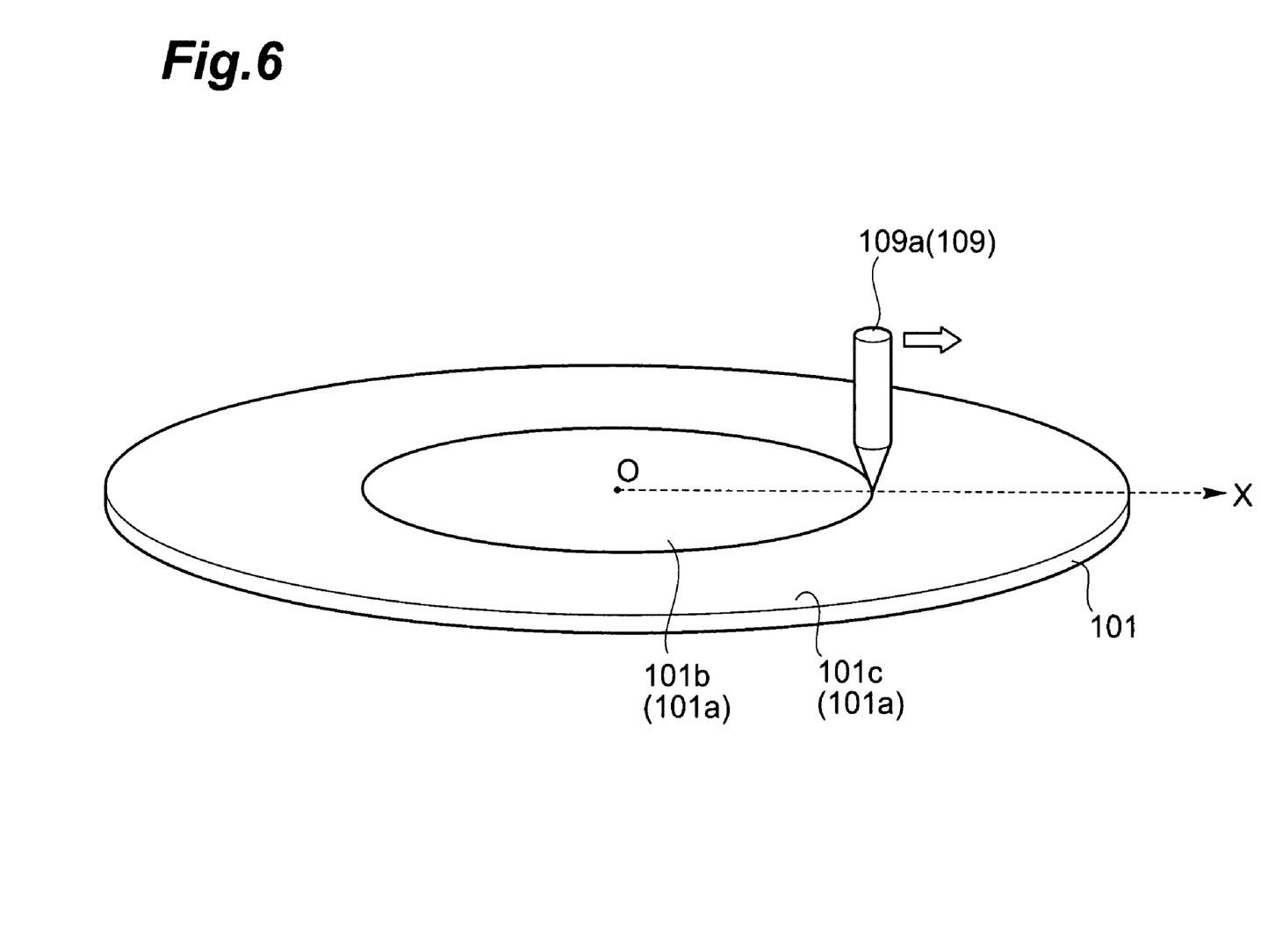
FIG. 6 is a schematic perspective view for explaining a facing step.
Figure 7:
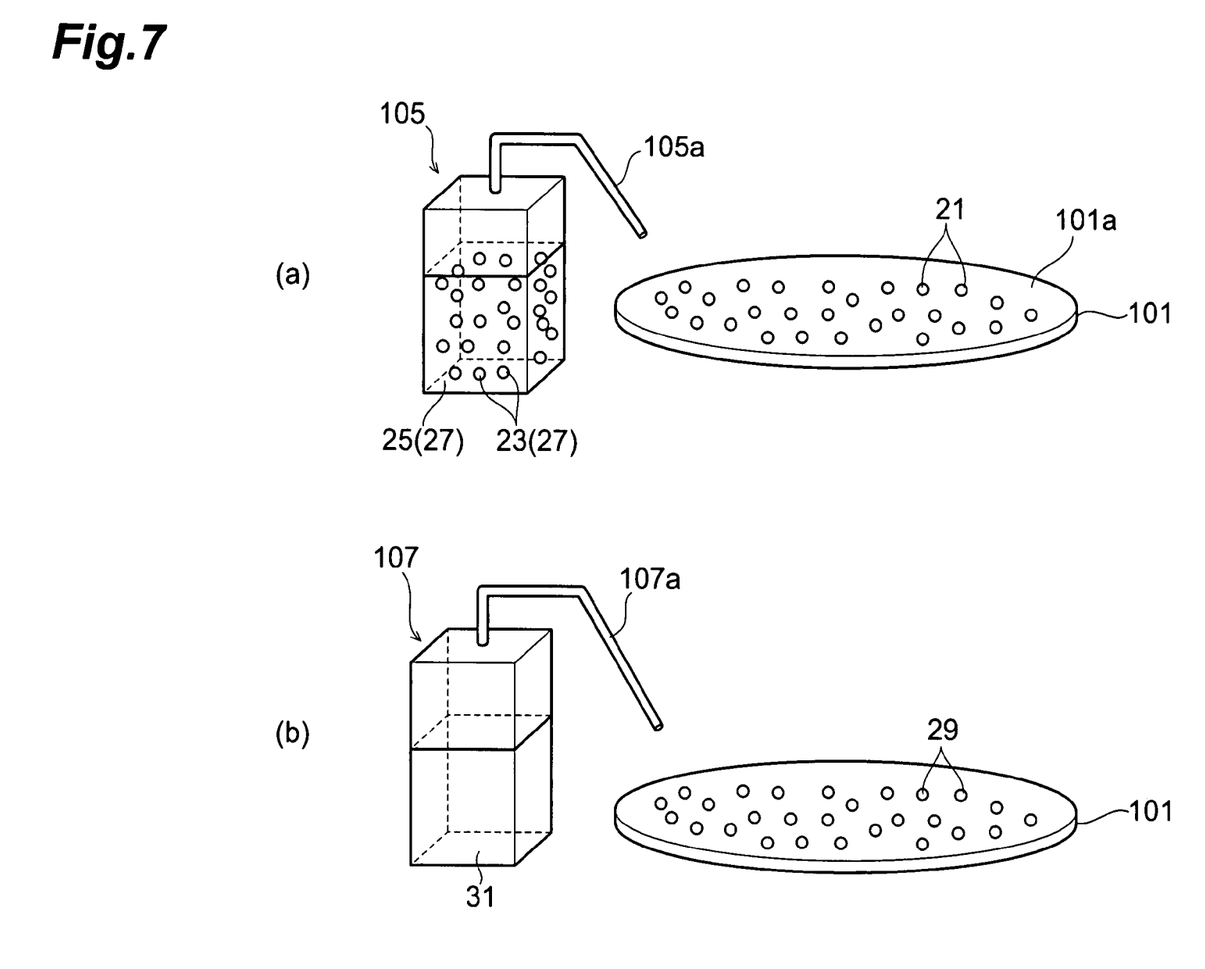
FIG. 7 is schematic perspective views for explaining the first and second polishing steps.
Figure 8:
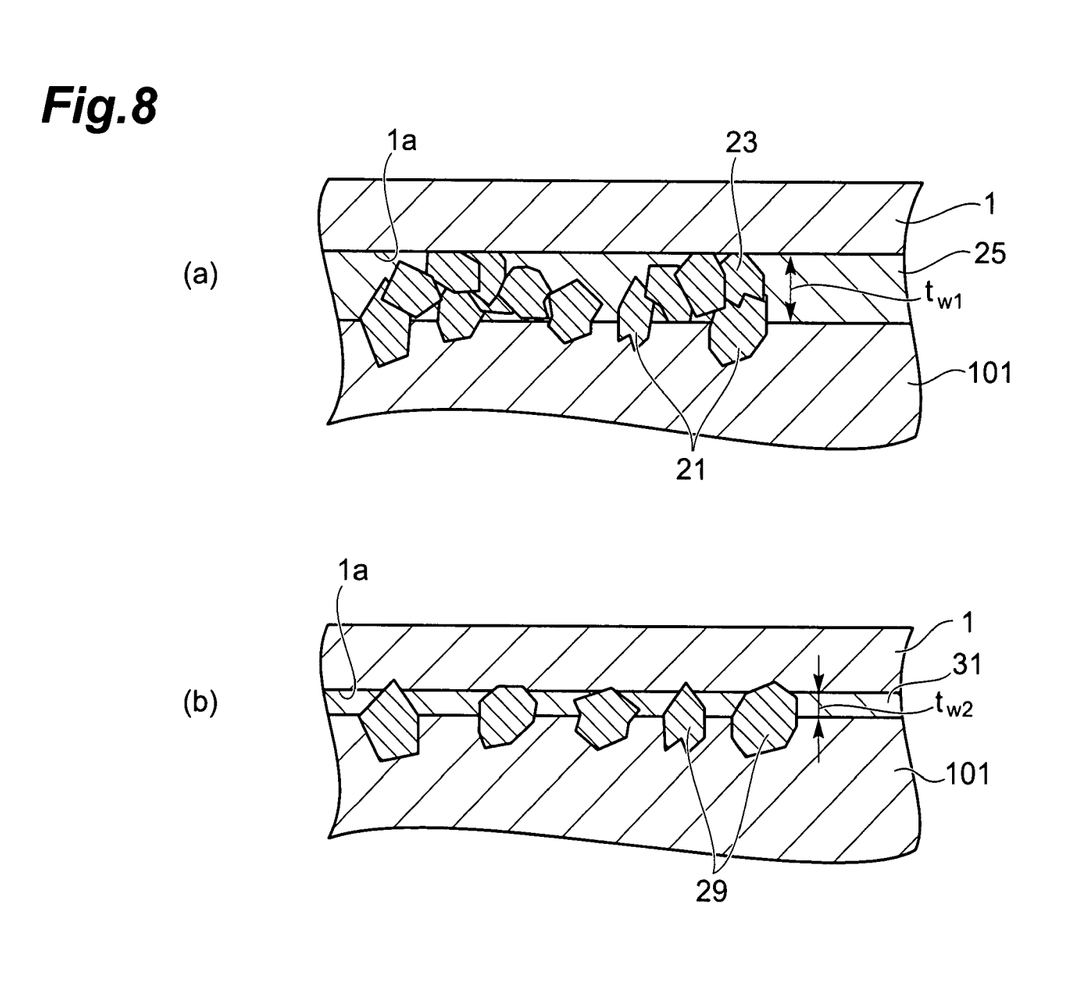
FIG. 8 is schematic sectional views for explaining the first and second polishing steps.

Each of the steps S1 to S5 will be described below in detail with reference to FIGS. 6 to 8. FIG. 6 is a schematic perspective view for explaining the facing step. FIG. 7(a) and FIG. 7(b) are schematic perspective views for explaining the first and second polishing steps, respectively. FIG. 8(a) and FIG. 8(b) are schematic sectional views for explaining the first and second polishing steps, respectively.

(Facing Step)

The surface 101a of the platen 101 may be cut so that the flatness of the platen 101 (TTV: Total Thickness Variation) becomes not more than 10 μm, as shown in FIG. 6, as occasion may demand. With the use of this platen 101, for example, the GaN substrate 1 of the diameter of 2 inches can be suitably polished. The shape of the surface 101a of the platen 101 is transferred onto the surface 1a of the GaN substrate 1. More preferably, the surface 101a of the platen 101 is cut so that the flatness of the part from the center point O to the periphery of the platen 101 (radial part) becomes not more than 5 μm. Particularly, in a case where the polishing is carried out using abrasives having a small average grain size, it is preferable to make the flatness of the platen 101 small.

For the cutting, it is preferable to use a diamond turning tool 109a. The diamond turning tool 109a constitutes the major part of the facing mechanism 109 (cf. FIG. 1). The diamond turning tool 109a moves along a radial direction X from the center point O to the periphery of the platen 101. The cutting is performed by moving the diamond turning tool 109a while rotating the platen 101. The rotating speed of the platen 101 is, for example, 400 rpm. In FIG. 6, the surface 101a of the platen 101 consists of an already-cut surface 101b and a yet-cut surface 101c. After the cutting, the surface 101a of the platen 101 is preferably cleaned as needed.

(Charging Step)

As shown in FIG. 7(a), abrasives 21 (third abrasives) may be buried in the platen 101 as occasion may demand. Specifically, for example, while supplying a polishing solution (not shown) containing the abrasives 21 and a lubricant (not shown) onto the surface 101a of the platen 101, the polishing jig 10 (cf. FIGS. 2 and 3) in a state in which the GaN substrate 1 is not bonded, and the platen 101 are rotated. In the present embodiment, the abrasives 21 are one for forming abrasives 29 in the second polishing step, as described later.

An example of charging conditions is presented below.
Drop rate of polishing solution: 5 cc/min
Rotating speed of drive ring 15: 60 rpm
Pressure of weight 13: 1.96×10$^4$ Pa (200 g/cm$^2$)
Charging time: 60 min or more (First Polishing Step)

As shown in FIG. 7(a), while supplying a polishing solution 27 containing abrasives 23 (first abrasives) and a lubricant 25 (first lubricant) onto the surface 101a of the platen 101, the GaN substrate 1 is polished using the platen 101 and the polishing solution 27. During the polishing, the platen 101 and polishing jig 10 are preferably rotated. The polishing solution 27 is preferably dropped from the dropping nozzle 105a of the dropping device 105 onto the surface 101a of the platen 101. In the first polishing step the GaN substrate 1 is polished by the abrasives 21, 23 as shown in FIG. 8(a). The lubricant 25 is filled between the GaN substrate 1 and the platen 101.

Most of the abrasives 21 are abrasive grains buried and fixed in the platen 101 (hereinafter also referred to as fixed grains), and most of the abrasives 23 are free grains not buried in the platen 101 (hereinafter also referred to as free abrasive grains). However, the abrasives 21 may be released in part to become free abrasive grains, or the abrasives 23 may be buried in part in the platen 101 to become fixed grains. The protruding amount $t_{w1}$ of the abrasives 21, 23 is large due to the abrasives 23 as free abrasive grains, as shown in FIG. 8(a).

An example of polishing conditions in the first polishing step is presented below.
GaN substrate 1: GaN single-crystal substrate having the diameter (φ) of 50.8 mm and the thickness of 400 μm
Drop rate of polishing solution 27: 5 cc/min
Maximum grain size of abrasives 23: 1 μm or less
Diameter (φ) of platen 101: 450 mm
Constituent material of platen 101: tin
Rotating speed of drive ring 15: 30 rpm
Swing speed of drive ring 15: 10 swings/min
Swing stroke: 30 mm
Pressure of weight 13: 1.96×10$^4$ Pa (200 g/cm$^2$)
Polishing time: 60 min After the GaN substrate 1 is polished using the abrasives 21, 23 in the first polishing step, the polishing solution 27 attached to the plate 17 and drive ring 15 (cf. FIGS. 2 and 3) is removed, if necessary, to clean the polishing jig 10. A cleaning method is, for example, ultrasonic cleaning using ultrapure water.

(Cleaning Step)

The surface 101a of the platen 101 may be cleaned by removing foreign matter on the platen 101 as occasion may demand. The foreign matter is, for example, cut chips of GaN substrate 1, free abrasive grains, etc. after the first polishing step. For the cleaning, it is preferable to use ultrapure water and a wiper that produces neither dust nor chips. However, even after the cleaning with this wiper, free abrasive grains could remain on the surface 101a of the platen 101 in some cases. In such cases, in order to bury the free abrasive grains into the platen 101, the polishing jig 10 without the GaN substrate 1 may be rotated on the platen 101, while rotating the platen 101. The cleaning step may be omitted if the polishing time in the first polishing step is short or if the concentration of the abrasives 23 in the polishing solution 27 is low.

When the cleaning step is carried out after the first polishing step and before the second polishing step, it is feasible to reduce the surface roughness Ra and the occurrence of scratch due to the foreign matter produced in the first polishing step.

(Second Polishing Step)

As shown in FIG. 7(b), while supplying a lubricant 31 (second lubricant) onto the platen 101 in which the abrasives 29 (second abrasives) are buried, the GaN substrate 1 is polished using the platen 101 in which the abrasives 29 are buried. During the polishing, it is preferable to rotate the platen 101 and the polishing jig 10. In the second polishing step, the GaN substrate 1 is polished with the abrasives 29, as shown in FIG. 8(b). The lubricant 31 is filled between the GaN substrate 1 and the platen 101.

The abrasives 29 are the abrasives buried in the platen 101, among the aforementioned abrasives 21, 23 and is thus fixed grains. The abrasives 21 buried in the platen 101 in the charging step may also be used as the abrasives 29. Since the abrasives 29 are fixed grains, the protruding amount $t_{w2}$ of the abrasives 29 is smaller than the protruding amount $t_{w1}$ of the abrasives 21, 23, as shown in FIG. 8(a) and FIG. 8(b). The smaller the protruding amount of the abrasives, the smaller the surface roughness Ra becomes. Therefore, the surface roughness Ra of the GaN substrate 1 after the second polishing step becomes smaller than the surface roughness Ra of the GaN substrate 1 after the first polishing step. Let $H_p$ be the hardness of the platen, $H_w$ be the hardness of the workpiece, and $\phi_d$ be the average grain size of the abrasives, and then the surface roughness Ra of the workpiece after polished is expressed, for example, by Eq (1) below.

$$Ra = \phi_d \times H_p / 4H_w \quad (1)$$

Figure 9:
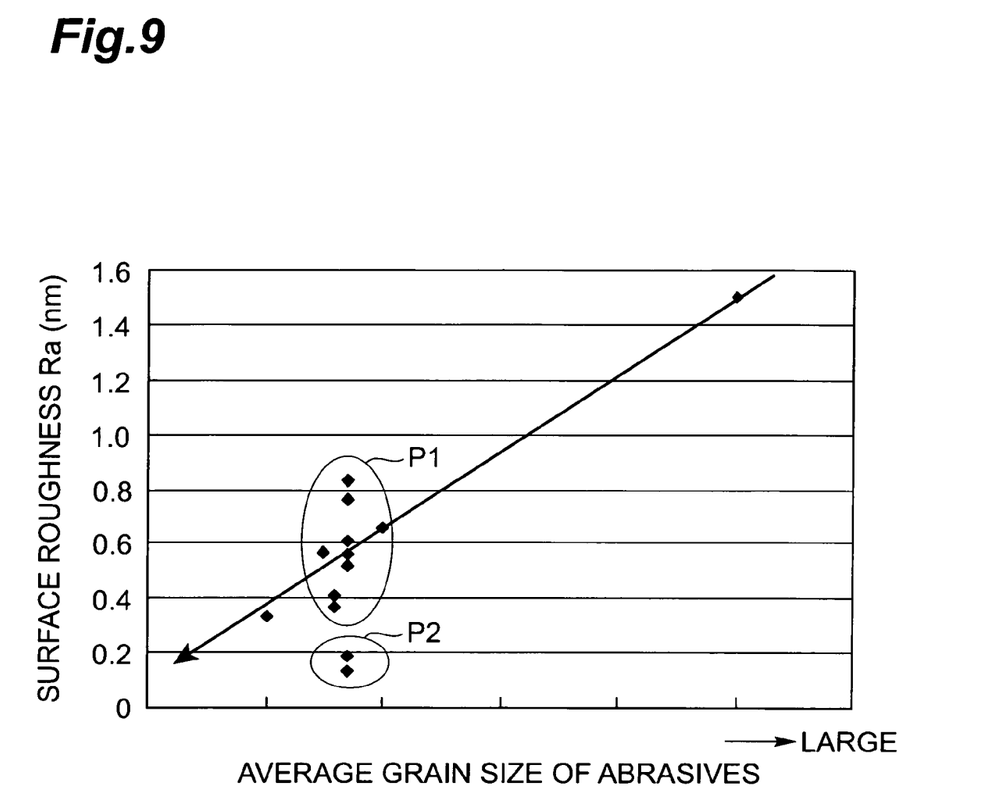
FIG. 9 is a graph showing relationship between the surface roughness Ra of GaN substrate after the first and second polishing steps, and the average grain size of abrasives.

FIG. 9 is a graph showing the relationship between the surface roughness Ra of the GaN substrate after the first and second polishing steps, and the average grain size of the abrasives. Points in region P1 in FIG. 9 indicate the surface roughness Ra of the GaN substrate 1 after the first polishing step, and points in region P2 the surface roughness Ra of the GaN substrate 1 after the second polishing step. Values of surface roughness Ra are values measured with an atomic force microscope (AFM). As apparent from this graph, the surface roughness Ra and variation of surface roughness Ra are smaller in the GaN substrate 1 after the second polishing step than in the GaN substrate 1 after the first polishing step.

An example of polishing conditions in the second polishing step is presented below.
Drop rate of lubricant 31: 5 cc/min
Peripheral speed v of platen 101: 28 m/min
Pressure of weight 13: $1.96 \times 10^4$ Pa (200 g/cm$^2$)
Polishing time: 60 min In the polishing method of the GaN substrate according to the present embodiment, as described above, the abrasives 29 are buried in the platen 101 in the second polishing step. For this reason, the abrasives 29 are prevented from flocculating together. In the second polishing step the protruding amount $t_{w2}$ of the abrasives 29 is small and uniform. Therefore, the second polishing step is able to polish the GaN substrate 1 while suppressing the occurrence of scratch. Furthermore, it is also feasible to made the surface roughness Ra of the GaN substrate 1 small after the second polishing step and to reduce the in-plane variation of surface roughness Ra. On the other hand, the polishing speed of the GaN substrate 1 can be set large in the first polishing step and, therefore, it is feasible to efficiently eliminate a mechanically damaged layer which is formed in the GaN substrate 1 by preprocessing such as slicing or cutting before the first polishing step. The GaN substrate in which the occurrence of scratch is suppressed well can be suitably produced by the polishing method of the GaN substrate according to the present embodiment.

In the first and second polishing steps, the peripheral speed v of the platen 101 shown in FIG. 1 is preferably not less than 7 m/min nor more than 57 m/min. The polishing speed of the GaN substrate 1 can be made larger in the case of the peripheral speed v of not less than 7 m/min than in the case of the peripheral speed v of less than 7 m/min, and productivity is also higher. In addition, it becomes easier to stabilize the rotation of the platen 101 and polishing jig 10 in the case of the peripheral speed v of not more than 57 m/min. Specifically, it is feasible to suppress fluctuation in the thrust direction (the axial direction of support rod 11 of polishing jig 10) which could cause scratches. For this reason, the number of scratches can be reduced when compared with the case where the peripheral speed v is larger than 57 m/min.

In the first and second polishing steps, the rotating speed of the platen 101 is preferably not less than 5 rpm nor more than 40 rpm. The polishing speed of the GaN substrate 1 can be made larger in the case of the rotating speed of not less than 5 rpm than in the case of the rotating speed of less than 5 rpm; therefore, productivity is higher. Since it becomes easier to stabilize the rotation of the platen 101 in the case of the rotating speed of not more than 40 rpm, the number of scratches can be reduced when compared with the case where the rotating speed is larger than 40 rpm.

As an example, Table 1 presents the results of measurements of the peripheral speed v of the platen 101, the rotating speed of the platen 101, and the number of scratches in the first polishing step. In Table 1, the "number of scratches" indicates the number of scratches produced in the surface of the GaN substrate having the diameter (φ) of 50.8 mm. The number of scratches was measured by visual inspection under a light-collecting lamp.

TABLE 1

| Peripheral Speed of Platen (m/min) | Rotating Speed of Platen (rpm) | Number of Scratches (Scratches) |
|---|---|---|
| 7 | 5 | 2 |
| 28 | 20 | 5 |
| 57 | 40 | 7 |
| 84 | 60 | 17 |
| 140 | 100 | 30 |

Next, as an example, Table 2 presents the results of measurements of the peripheral speed v of the platen 101, the rotating speed of the platen 101, and the number of scratches in the second polishing step. In Table 2, the "number of scratches" indicates the number of scratches produced in the surface of the GaN substrate having the diameter (φ) of 50.8 mm. The number of scratches was measured by visual inspection under a light-collecting lamp.

TABLE 2

| Peripheral Speed of Platen (m/min) | Rotating Speed of Platen (rpm) | Number of Scratches (Scratches) |
|---|---|---|
| 7 | 5 | 0 |
| 28 | 20 | 0 |
| 57 | 40 | 0 |
| 84 | 60 | 5 |
| 140 | 100 | 10 |

The Vickers hardnesses of the abrasives 21, 23, 29 are preferably larger than the Vickers hardness of GaN (1300 kg/mm²). Therefore, a constituent material for the abrasives 21, 23, 29 is preferably selected, for example, from diamond, carbides such as SiC, oxides such as $Al_2O_3$, nitrides such as cBN and $Si_3N_4$, and so on. Among these, diamond is particularly preferred in terms of accuracy of classification, price, work efficiency, accuracy of working, and so on. For example, where the abrasives 21, 23 are diamond grains, an improvement can be made in the polishing efficiency of the GaN substrate 1 in the first polishing step. Where the abrasives 29 are diamond grains, an improvement can be made in the polishing efficiency of the GaN substrate 1 in the second polishing step.

The constituent material of the platen 101 is preferably an alloy containing tin 50 or more % by mass. The platen 101 may have a coating layer made of an alloy containing tin 50 or more % by mass. The alloy containing tin 50 or more % by mass is softer than metal such as copper, and thus the protruding amount $t_{w1}$ of the abrasives 21, 23 and the protruding amount $t_{w2}$ of the abrasives 29 in the platen 101 (cf. FIG. 8) become smaller. For this reason, the surface roughness Ra of the GaN substrate 1 after the first and second polishing steps can be made smaller and it is feasible to suppress the occurrence of scratch.

As an example, Table 3 presents the results of measurements of the constituent material of the platen 101, the surface roughness Ra of the GaN substrate 1, and the number of scratches in the second polishing step. In Table 3, the "number of scratches" indicates the number of scratches produced in the surface of the GaN substrate having the diameter (φ) of 50.8 mm. The number of scratches was measured by visual inspection under a light-collecting lamp. The surface roughness Ra was measured with an atomic force microscope (AFM).

TABLE 3

| Constituent Material of Platen | Surface Roughness Ra of GaN Substrate (nm) | Number of Scratches (Scratches) |
|---|---|---|
| tin ≧ 99 mass % | 1 | 0 |
| tin 70 mass % lead 30 mass % | 2 | 0 |
| tin 50 mass % lead 50 mass % | 5 | 0 |
| tin 30 mass % lead 70 mass % | 10 | 10 or more |
| tin 95 mass % bismuth 5 mass % | 1.5 | 0 |
| tin 97 mass % stibium 3 mass % | 1.5 | 0 |

As shown in Table 3, the constituent material of the platen 101 is preferably an alloy containing tin 50 or more % by mass. The GaN substrates with the surface roughness Ra of not more than 5 nm and with the number of scratches of 0 can be suitably applied to such devices as LEDs and LDs. Use of bismuth or antimony is rather preferable than lead, in order to prevent environment pollution.

When the platen 101 is made of tin, the abrasives 21, 23, 29 can be strongly held and fixed in the platen 101 where the abrasives 21, 23, 29 are diamond grains.

Since the polishing method of the GaN substrate according to the present embodiment involves carrying out the facing step as described above, an improvement is made in the flatness of the GaN substrate 1 after the first and second polishing steps. In the facing step, preferably, grooves (not shown) of spiral shape or concentric circular shape with the center on the center point O are preferably formed in the surface 101a of the platen 101. They decrease the friction resistance between the GaN substrate 1 and the platen 101 and facilitates supply of the polishing solution 27 or lubricant 31 to between the GaN substrate 1 and the platen 101, in the first and second polishing steps.

Since the polishing method of the GaN substrate according to the present embodiment involves carrying out the charging step as described above, the in-plane variation can be reduced in the protruding amount $t_{w2}$ of the abrasives 29. This decreases the in-plane variation of the polishing speed and surface roughness Ra of the GaN substrate 1 in the second polishing step. Further, it also suppresses the occurrence of scratch. When the charging step is carried out before the first polishing step, the polishing speed in the first polishing step is stabilized at a start of polishing.

The lubricants 25, 31 are preferably, for example, those consisting primarily of ethylene glycol, such as polyethylene glycol or monoethylene glycol, and water. Specifically, for example, the total content of ethylene glycol and water relative to the total amount of the lubricant is preferably not less than 95% by mass. The ethylene glycol may be replaced, for example, by polyethylene alcohol, glycerin, lactitol, sorbitol, or the like. Specifically, for example, the total amount of water and polyethylene alcohol, glycerin, lactitol, or sorbitol to the total amount of the lubricant is preferably not less than 95% by mass.

In the above-described case, since the lubricants 25, 31 are water-soluble, it becomes easier to clean the GaN substrate 1, and the polishing apparatus 100 such as the platen 101 after the first and second polishing steps. Since GaN does not react with water, the water-soluble lubricants can be used. This enhances workability of cleaning and also decreases cleaning cost. When the lubricants 25, 31 contain ethylene glycol, polyethylene alcohol, glycerin, lactitol, or sorbitol, it is feasible to prevent the lubricants 25, 31 from evaporating in the first and second polishing steps, and to achieve anticorrosion of the platen 101.

Since the present embodiment uses the platen 101 used in the first polishing step, as the platen used in the second polishing step, there is no need for consideration to the individual difference between platens (e.g., difference in surface shape or the like). Therefore, when the GaN substrate 1 after polished on the platen 101 in the first polishing step is polished on the platen 101 in the second polishing step, the shape of the surface 1a of the GaN substrate 1 fits the shape of the surface 101a of the platen 101. For this reason, it is feasible to suppress the occurrence of scratch after the second polishing step.

The preferred embodiment of the present invention was described above in detail, but the present invention is by no means limited to the above embodiment.

For example, the above embodiment may be arranged without one or more of the facing step, the charging step, and the cleaning step. When the charging step is omitted, the abrasives 21 are not buried in the platen 101 in the first polishing step. At this time, the abrasives 23 are gradually buried into the platen 101 during the polishing in the first polishing step, and thus the buried abrasives 23 become fixed grains. The fixed grains work as the abrasives 29 in the second polishing step.

The facing step and the charging step may also be carried out after the first polishing step and before the second polishing step. Alternatively, the facing step may be carried out before the first polishing step, and the charging step may be carried out after the first polishing step and before the second polishing step. The same effect as in the above embodiment is also achieved in either case. In these cases, the abrasives 21 work as the abrasives 29.

The above embodiment used the platen 101 used in the first polishing step, as the platen used in the second polishing step, but it is also possible to use different platens as the platen used in the first polishing step (first platen) and as the platen used in the second polishing step (second platen). In this case, the facing step and the charging step may be carried out on the first platen before the first polishing step, or may be carried out on the second platen before the second polishing step. The same effect as in the above embodiment is also achieved in either case.

The invention claimed is:

1. A method of polishing a GaN substrate of which surface to be polished has Ga portions and N portions alternatively arranged, comprising:
   a first polishing step of polishing the GaN substrate held by a polishing jig, using a first platen made of a material including tin and a polishing solution, while supplying the polishing solution containing first abrasives and a first lubricant, onto the first platen;
   a second polishing step of polishing the GaN substrate held by the polishing jig, using a second platen, made of a material including tin, in which second abrasives are buried, while supplying a second lubricant onto the second platen in which the second abrasives are buried, after the first polishing step; and
   in at least one of the first and second polishing steps, rotating the first or second platen and the polishing jig in the same direction.

2. The polishing method of the GaN substrate according to claim 1, wherein a peripheral speed of the first platen and a peripheral speed of the second platen are not less than 7 m/min nor more than 57 m/min.

3. The polishing method of the GaN substrate according to claim 1, wherein the first abrasives are diamond grains.

4. The polishing method of the GaN substrate according to claim 1, wherein a constituent material of the first platen and a constituent material of the second platen are an alloy containing tin 50 or more % by mass.

5. The polishing method of the GaN substrate according to claim 1, further comprising:
   a facing step of cuffing the second platen so as to achieve flatness of not more than 10 μm, before the second polishing step; and
   a charging step of burying third abrasives for forming the second abrasives, into the second platen, after the facing step and before the second polishing step.

6. The polishing method of the GaN substrate according to claim 1, wherein the first lubricant and the second lubricant consist primarily of ethylene glycol and water.

7. The polishing method of the GaN substrate according to claim 1, wherein the second polishing step uses the first platen as the second platen.

8. The polishing method of the GaN substrate according to claim 7, further comprising a cleaning step of cleaning foreign matter on the first platen, after the first polishing step and before the second polishing step.

9. The polishing method of the GaN substrate according to claim 1, wherein the polishing jig has radially extending grooves.

10. A polishing apparatus for a GaN substrate of which surface to be polished has Ga portions and N portions alternatively arranged, comprising:
    a polishing jig for rotatably holding the GaN substrate; and
    a platen made of a material including tin and configured to be rotated in the same direction as the polishing jig to polish the GaN substrate held between the polishing jig and the platen.

11. The polishing apparatus according to claim 10, wherein the polishing jig has radially extending grooves.

12. A method of polishing a GaN substrate, comprising:
    a first polishing step of polishing the GaN substrate held by a polishing jig, using a first platen and a polishing solution, while supplying the polishing solution containing first abrasives and a first lubricant, onto the first platen;
    a second polishing step of polishing the GaN substrate held by the polishing jig, using a second platen in which second abrasives are buried, while supplying a second lubricant onto the second platen in which the second abrasives are buried, after the first polishing step; and
    in at least one of the first and second polishing steps, rotating the first or second platen and the polishing jig in the same direction, wherein
    the first step including supplying the polishing solution between the GaN substrate and the first platen through grooves arranged in a surface of the polishing jig where the GaN substrate is held, and
    the second step including supplying the second lubricant between the GaN substrate and the first platen through the grooves.

13. A polishing apparatus for a GaN substrate, comprising:
    a polishing jig for rotatably holding the GaN substrate; and
    a platen configured to be rotated in the same direction as the polishing jig to polish the GaN substrate held between the polishing jig and the platen, wherein
    the polishing jig has radially extending grooves arranged in an area surrounding the GaN substrate.

14. The polishing apparatus according to claim 13, wherein the grooves are configured at least for reducing friction between the GaN substrate and the platen.

* * * * *